(12) United States Patent
Mori

(10) Patent No.: US 7,417,898 B2
(45) Date of Patent: Aug. 26, 2008

(54) NON-VOLATILE SEMICONDUCTOR MEMORY DEVICE

(75) Inventor: Toshiki Mori, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 32 days.

(21) Appl. No.: 11/436,632

(22) Filed: May 19, 2006

(65) Prior Publication Data
US 2007/0025147 A1 Feb. 1, 2007

(30) Foreign Application Priority Data
Jul. 28, 2005 (JP) ............... 2005-218515

(51) Int. Cl.
*G11C 11/34* (2006.01)
(52) U.S. Cl. ............... 365/185.2; 365/185.22
(58) Field of Classification Search ............ 365/189.05, 365/189.18, 185.2, 185.08, 185.14, 185.21, 365/185.26, 185.02, 185.33
See application file for complete search history.

(56) References Cited

U.S. PATENT DOCUMENTS

| | | | | |
|---|---|---|---|---|
| 5,530,673 A * | 6/1996 | Tobita et al. ........... | 365/185.09 |
| 5,627,781 A * | 5/1997 | Hayashi et al. .......... | 365/185.2 |
| 5,717,632 A * | 2/1998 | Richart et al. ............ | 365/185.2 |
| 6,011,725 A * | 1/2000 | Eitan ..................... | 365/185.33 |
| 6,639,849 B2 | 10/2003 | Takahashi et al. | |
| 6,643,170 B2 | 11/2003 | Huang et al. | |
| 6,690,602 B1 * | 2/2004 | Le et al. ................. | 365/185.33 |
| 6,768,673 B1 * | 7/2004 | Hsia et al. .............. | 365/185.03 |
| 6,839,279 B2 | 1/2005 | Yamada | |
| 7,113,431 B1 * | 9/2006 | Hamilton et al. ....... | 365/185.29 |
| 2004/0013000 A1 * | 1/2004 | Torii ..................... | 365/185.22 |
| 2004/0130946 A1 * | 7/2004 | Uribe et al. ............ | 365/185.03 |
| 2004/0151052 A1 * | 8/2004 | Hidaka .................. | 365/230.06 |
| 2004/0257873 A1 | 12/2004 | Shieh et al. | |
| 2006/0023501 A1 * | 2/2006 | Kasuta ................... | 365/185.2 |

* cited by examiner

*Primary Examiner*—Huan Hoang
*Assistant Examiner*—Fernando N Hidalgo
(74) *Attorney, Agent, or Firm*—McDermott Will & Emery LLP

(57) ABSTRACT

Charge is trapped into a charge trapping region of one of two reference cells so as to achieve a state equivalent to memory cell characteristics having a smallest amount of current. Charge is trapped into a charge trapping region of the other reference cell so as to achieve a state equivalent to memory cell characteristics having a largest amount of current. Currents output from these reference cells are averaged by a current averaging circuit, and the resultant average current is output as a reference current R_REF 1.

10 Claims, 14 Drawing Sheets

NON-VOLATILE SEMICONDUCTOR MEMORY DEVICE

CROSS REFERENCE TO RELATED APPLICATION

This Non-provisional application claims priority under 35 U.S.C. §119(a) on Patent Application No. 2005-218515 filed in Japan on Jul. 28, 2005, the entire contents of which are hereby incorporated by reference.

BACKGROUND OF THE INVENTION

1. Field of the Invention

The present invention relates to a non-volatile semiconductor memory device, and more particularly, to a non-volatile semiconductor memory device of storing a plurality of pieces of information using different charge trapping regions in a charge trapping layer, in which a memory cell is composed of a MOS transistor having a charge trapping layer in a gate dielectric layer.

2. Description of the Related Art

Non-volatile semiconductor memory devices have been widely applied to information systems and communications systems because of their capability of holding memory information even when power source is switched off. Among them, a flash EEPROM (EEPROM: Electrically Erasable Programmable ROM, hereinafter referred to as a flash memory) performs an erase operation with respect to the whole chip or on a block-by-block basis, thereby reducing the size of each memory cell and achieving low cost. Therefore, there is a rapidly increasing demand for the flash memory.

Examples of a memory cell applicable to the flash memory include a memory cell with a double-layer polysilicon structure which is composed of a floating gate and a control gate, a memory cell composed of a MOS transistor having a charge trapping layer in a gate dielectric layer (hereinafter referred to as a MONOS memory cell), and the like. Among them, the MONOS memory cell is characterized in that one memory cell has two different regions each storing information, thereby making it possible to achieve low cost and large capacity, and that miniaturization is easily achieved. Therefore, those having the MONOS memory cell have become a mainstream flash memory (see, for example, U.S. Pat. No. 6,011,725).

In the flash memory having the MONOS memory cell, information is read from one of the two regions by, for example, comparing a magnitude of a read reference current output from a reference cell having the same structure as that of the memory cell with a magnitude of a memory cell current output from the one region of the memory cell.

When a program operation has been performed with respect to the memory cell, the memory cell has current characteristics such that a threshold value is shifted while holding current characteristics similar to current characteristics of the memory cell in an erased state. Therefore, by setting the read reference current output from the reference cell to have characteristics such that a threshold value is shifted while holding current characteristics equivalent to those of the memory cell current, an optimal reference can be created.

In this read operation, if the read reference current is set to be a mean current between a current of the memory cell in an information-erased state and a current of the memory cell in an information-programmed state, a difference between the reference current and the memory cell current in the erased state and a difference between the reference current and the memory cell current in the programmed state are equal to each other. Therefore, a margin between a program operation and a read operation can be maximized.

However, the MONOS memory cell has a specific effect that the memory cell current characteristics of one of the regions is affected by a state of the other region (hereinafter referred to as a second bit effect) (see, for example, U.S. Pat. No. 6,643,170).

For example, when, after information is set into one of the regions, information is programmed into the other region, the memory cell current characteristics of the one region vary. Therefore, in the case where the reference current is set as described above, the difference between the reference current and the memory cell current in the erased state and the difference between the reference current and the memory cell current in the programmed state are different from each other. The second bit effect is not dependent of a physical position of the charge trapping region in the memory cell, and is such that a state of a bit previously set is affected by a state of a bit written later.

As described above, in conventional non-volatile semiconductor memory devices having the MONOS memory cell, the memory cell current characteristics vary due to the second bit effect, so that the difference between the reference current and the current in each memory state is reduced, resulting in a small operation margin when information is read. Particularly, when a plurality of memory states are achieved by changing the amount of trapped charge to store multi-bit information, the reduction of the operation margin due to the influence of the second bit effect is significant.

Also, in the case of the MONOS memory cell, a predetermined range of voltage is applied to the memory cell, and therefore, in order to avoid the influence of the second bit effect, the reference current might be optimized in the vicinity of a middle of the applied voltage range, depending on the variation due to the second bit effect. In this case, however, the read margin is decreased in a lower limit portion and an upper limit portion of the voltage range.

Therefore, in conventional non-volatile semiconductor memory devices having the MONOS memory cell, it is difficult to achieve multi-bit memory. Even in a binary MONOS memory cell, if an operation margin is small, it is difficult to achieve a low-voltage operation.

SUMMARY OF THE INVENTION

In view of the above-described problems, the present invention has been achieved. An object of the present invention is to provide a non-volatile semiconductor memory device having a large read margin by setting an appropriate reference current even in the presence of the influence of the second bit effect.

To solve the above-described problems, the present invention provides a non-volatile semiconductor memory device comprising a memory cell composed of a transistor having a charge trapping layer in a gate dielectric layer, in which charge is trapped in a first charge trapping region and a second charge trapping region, which are different from each other, in the charge trapping layer, and information is stored in each charge trapping region, depending on an trapped charge level, a plurality of read reference cells having the same structure as that of the memory cell and including a first read reference cell and a second read reference cell, a read reference cell setting section of setting a first charge trapping region of the first read reference cell into a first state in which a first charge amount is trapped, setting a second charge trapping region of the first read reference cell into a second state in which a second charge amount is trapped, setting a first charge trapping region of the second read reference cell into a third state in which a third charge amount larger than the first charge amount is trapped, and setting a second charge trapping region of the second read reference cell into a fourth state in which a fourth charge amount smaller than the second charge amount is trapped, and a reference information output section of outputting combination information of first information which is accumulation information about the first charge trapping region of the first read reference cell and second information which is accumulation information about the first charge trapping region of the second read reference cell, as a read reference which is used as a reference when information is read from the memory cell.

Thereby, it is possible to optimize a reference current irrespective of a variation in current characteristics due to the second bit effect, thereby optimizing a read operation margin.

According to one embodiment of the present invention, in the non-volatile semiconductor memory device, a plurality of the first read reference cells and a plurality of the second read reference cells are provided, and the read reference cell setting section is configured to perform the setting with respect to a plurality of first read reference cells and a plurality of second read reference cells.

According to one embodiment of the present invention, in the non-volatile semiconductor memory device, the first information and the second information are a read current value of the first read reference cell and a read current value of the second read reference cell, respectively, and the combination information is an average value of a read current value of the first read reference cell and a read current value of the second read reference cell.

According to one embodiment of the present invention, in the non-volatile semiconductor memory device, the first information and the second information are a read current value of the first read reference cell and a read current value of the second read reference cell, respectively, and the combination information is an average value of read current values of a plurality of first read reference cells and read current values of a plurality of second read reference cells.

Thereby, it is possible to optimize a reference current irrespective of a variation in current characteristics due to the second bit effect, thereby optimizing a read operation margin.

According to one embodiment of the present invention, a non-volatile semiconductor memory device comprises a memory cell composed of a transistor having a charge trapping layer in a gate dielectric layer, in which charge is trapped in a first charge trapping region and a second charge trapping region, which are different from each other, in the charge trapping layer, and information is stored in each charge trapping region, depending on an trapped charge level, a plurality of write verification reference cells having the same structure as that of the memory cell, in which a write verification reference is set, the write verification reference being a reference for a charge level to be trapped when information is programmed into the first charge trapping region or the second charge trapping region of the memory cell, a verification reference setting section of setting a plurality of write verification references having different levels into the write verification reference cells with respect to the same type of information, and a verification section of performing write verification using one write verification reference selected from the plurality of write verification references in a write verification operation performed after writing of information.

According to one embodiment of the present invention, in the non-volatile semiconductor memory device, a read current value of one of the first charge trapping region and the second charge trapping region varies depending on charge trapped in the other charge trapping region, and the verification reference setting section is configured to set a verification reference having a magnitude depending on an amount of the variation.

Thereby, a program level with respect to a charge trapping region in which information is programmed earlier is controlled, depending on information which is programmed later. Thereby, the influence of the second bit effect can be reduced, so that a reduction in a read operation margin can be suppressed.

According to one embodiment of the present invention, a non-volatile semiconductor memory device comprises a memory cell array having memory cells arranged in an array, each memory cell being composed of a transistor having a charge trapping layer in a gate dielectric layer, in which charge is trapped in a first charge trapping region and a second charge trapping region, which are different from each other, in the charge trapping layer, so that information is stored in each charge trapping region, a write information buffer of holding information to be programmed into the memory cell array, a write section of writing the information held by the write information buffer into the first charge trapping region, a program level control section of performing a control so that the write section performs writing until a charge amount trapped in the first charge trapping region reaches a set level, and a level switching section of switching the set level with respect to the same type of information into a plurality of levels, depending on information to be programmed into the second charge trapping region.

According to one embodiment of the present invention, in the non-volatile semiconductor memory device, the write information buffer has a memory capacity of holding an information amount larger than an information amount which can be programmed into the memory cell array at once.

According to one embodiment of the present invention, the non-volatile semiconductor memory device further comprises a plurality of write verification reference cells each having the same structure as that of the memory cell, in which a write verification reference is set, the write verification reference being a reference for a charge level to be trapped when information is programmed into the first charge trapping region or the second charge trapping region of the memory cell. The program level control section includes a verification reference setting section of setting a plurality of write verification references having different levels into the write verification reference cells with respect to the same type of information, and a verification section of performing write verification using one write verification reference selected from the plurality of write verification references in a write verification operation performed after writing of information.

According to one embodiment of the present invention, in the non-volatile semiconductor memory device, the level switching section has a section of reading data to be written into the second charge trapping region, from the write information buffer, when information is programmed into the first charge trapping region.

Thereby, when current characteristics of a memory cell vary due to the second bit effect, it is possible to optimize a reference current, thereby setting a read operation margin to have an optimal value.

According to one embodiment of the present invention, in the non-volatile semiconductor memory device, the level switching section is configured not to perform the switching when information corresponding to a smallest charge level is programmed into the first charge trapping region, and the program level control section is configured to perform a control so that the write section performs writing until a fixedly determined set level is reached, when information corresponding to a smallest charge level is programmed into the first charge trapping region.

Thereby, it is possible to reduce the number of types of write references.

According to one embodiment of the present invention, in the non-volatile semiconductor memory device, the verification reference setting section is configured to trap a target program level of charge into a first charge trapping region of a first write verification reference cell and a first charge trapping region of a second write verification reference cell, trap a target program level of charge into a second charge trapping region of the first write verification reference cell, and perform writing with respect to a first charge trapping region of a third write verification reference cell so that a sum of a read current of the first charge trapping region of the first write verification reference cell and a read current of the first charge trapping region of the third write verification reference cell is twice as large as a read current of the first charge trapping region of the second write verification reference cell.

According to one embodiment of the present invention, in the non-volatile semiconductor memory device, the verification reference setting section is configured to trap a target program level of charge into a second charge trapping region of a first write verification reference cell and a second charge trapping region of a second write verification reference cell, and trap charge into a first charge trapping region of the second write verification reference cell so that a read current of a first charge trapping region of the first write verification reference cell is equal to a read current of the first charge trapping region of the second write verification reference cell, and neutralizes charge trapped in the second charge trapping region of the second write verification reference cell.

Thereby, charge is trapped in the write verification reference cell, depending on a write reference current to be output.

DETAILED DESCRIPTION OF THE PREFFERED EMBODYMENTS

Hereinafter, embodiments of the present invention will be described with reference to the accompanying drawings.

Embodiment 1 of the Invention

A reference current generating circuit according to Embodiment 1 of the present invention will be described which is used to generate a reference current which provides a criterion for a magnitude of a current flowing from an information memory cell of a non-volatile semiconductor memory device when information is read from the information memory cell.

Figure 1:
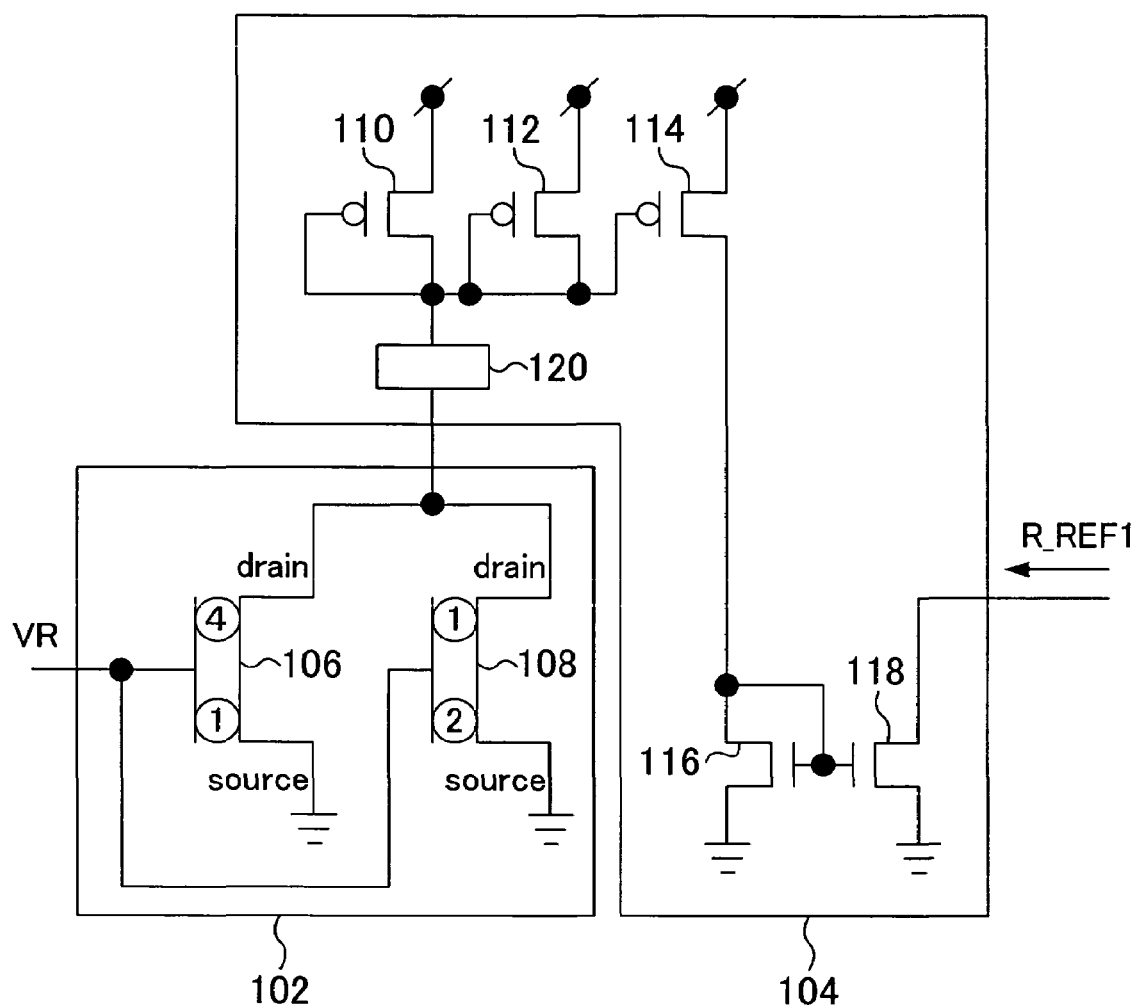
FIG. 1 is a block diagram illustrating a configuration of a reference current generating circuit according to Embodiment 1 of the present invention.

FIG. 1 is a block diagram illustrating a configuration of a reference current generating circuit 100 according to Embodiment 1 of the present invention. As illustrated in FIG. 1, the reference current generating circuit 100 is composed of a reference cell section 102 and a current averaging circuit 104.

The reference cell section 102 is composed of a reference cell 106 and a reference cell 108. The reference cells 106 and 108 are each a MONOS memory cell having the same configuration as that of an information memory cell (not shown). Firstly, the MONOS memory cell will be described in detail.

Figure 2:
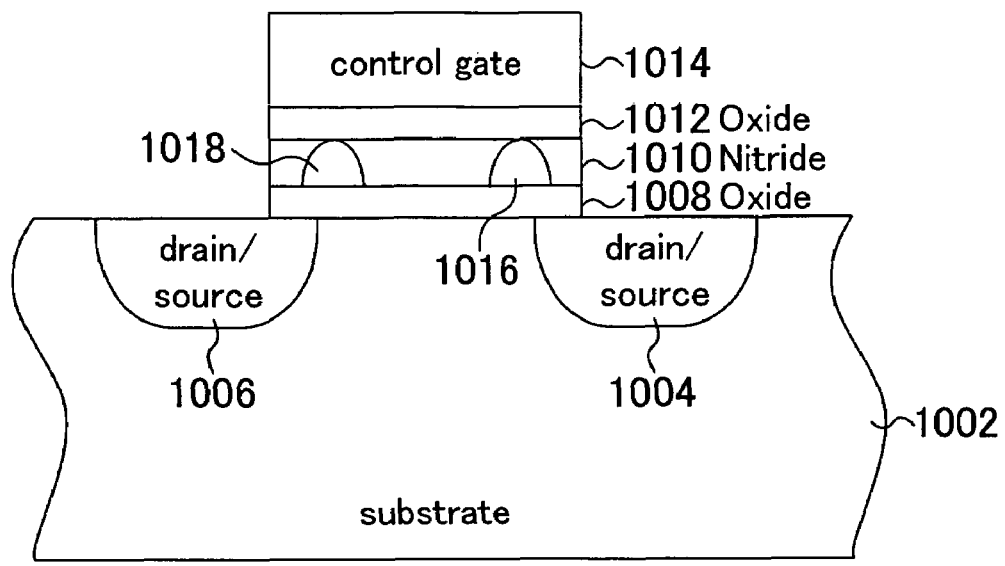
FIG. 2 is a diagram illustrating a structure of a MOS transistor used in a MONOS memory cell.

Specifically, the MONOS memory cell is composed of a MOS transistor 1000 having a structure illustrated in FIG. 2.

The MOS transistor 1000 is composed of drain/source regions 1004 and 1006 made of an N-type semiconductor region formed on a surface of a P-type semiconductor substrate 1002, a channel region between the drain/source regions 1004 and 1006, a silicon oxide film 1008 provided on the channel region, a silicon nitride film 1010 provided on the silicon oxide film 1008, a silicon oxide film 1012 provided on the silicon nitride film 1010, and a control gate electrode 1014 provided on the silicon oxide film 1012.

The MOS transistor 1000 stores information by trapping electrons in the silicon nitride film 1010. Specifically, two charge trapping regions 1016 and 1018 are used as regions for trapping electrons, and each charge trapping region stores 2-bit information.

An operation of trapping electrons in the charge trapping region 1016 or 1018 is referred to as a program operation. For example, information is programmed into the charge trapping region 1016 as follows. The drain/source region 1006 is caused to have a ground potential, about 5 V is applied to the drain/source region 1004, and a high voltage of about 9 V is applied to the control gate electrode 1014, thereby causing a current to flow from the drain/source region 1004 to the drain/source region 1006 so that electrons occurring in the vicinity of the drain/source region 1004 are injected into the charge trapping region 1016. A charge trapping circuit which performs such a program operation is provided in the non-volatile semiconductor memory device.

Information stored in the charge trapping region 1016 is read as follows. The drain/source region 1004 is caused to have a ground potential, a potential of about 1 V is applied to the drain/source region 1006, and a read potential of about 3 V is applied to the control gate electrode 1014. Under such a bias condition, a value of a current flowing from the drain/source region 1006 to the drain/source region 1004 varies depending on the presence or absence of trap of electrons in the charge trapping region 1016. Information stored in the charge trapping region 1016 is read as this current difference.

Information is programmed into the charge trapping region 1018 as follows. The voltages applied to the drain/source regions 1004 and 1006 are reversed as compared to when information is programmed into the charge trapping region 1016. Specifically, the drain/source region 1004 is caused to have a ground potential, about 5 V is applied to the drain/source region 1006, and a high voltage of about 9 V is applied to the control gate electrode 1014, thereby causing a current to flow from the drain/source region 1006 to the drain/source region 1004 so that electrons occurring in the vicinity of the drain/source region 1006 are injected into the charge trapping region 1018.

Information stored in the charge trapping region 1018 is read as follows. The drain/source region 1006 is caused to have a ground potential, a potential of about 1 V is applied to the drain/source region 1004, and a read potential of about 3 V is applied to the control gate electrode 1014. Under such a bias condition, a value of a current flowing from the drain/source region 1004 to the drain/source region 1006 varies depending on the presence or absence of trap of electrons in the charge trapping region 1018. Information stored in the charge trapping region 1018 is read as this current difference.

An operation of neutralizing electrons trapped in the charge trapping region 1016 or 1018 is referred to as an erase operation. For example, information stored in the charge trapping region 1016 is erased as follows. The drain/source region 1006 is caused to be in a floating state, about 7 V is applied to the drain/source region 1004, and a negative voltage of about −5 V is applied to the control gate electrode 1014, thereby injecting, to the charge trapping region 1016, holes occurring in an end portion of the drain/source region 1004 due to the band-to-band tunneling phenomenon.

Information stored in the charge trapping region 1018 is erased as follows. The voltages applied to the drain/source regions 1004 and 1006 are reversed as compared to when information stored in the charge trapping region 1016 is erased. Specifically, the drain/source region 1004 is caused to be in a floating state, about 7 V is applied to the drain/source region 1006, and a negative voltage of about −5 V is applied to the control gate electrode 1014, thereby injecting, to the charge trapping region 1016, holes occurring in an end portion of the drain/source region 1006 due to the band-to-band tunneling phenomenon. Thus, the two charge trapping regions 1016 and 1018 provided in one memory cell can be separately controlled.

It is here assumed that bit information stored in the charge trapping region 1016 is represented by a bit A and bit information stored in the charge trapping region 1018 is represented by a bit B.

Figure 3:
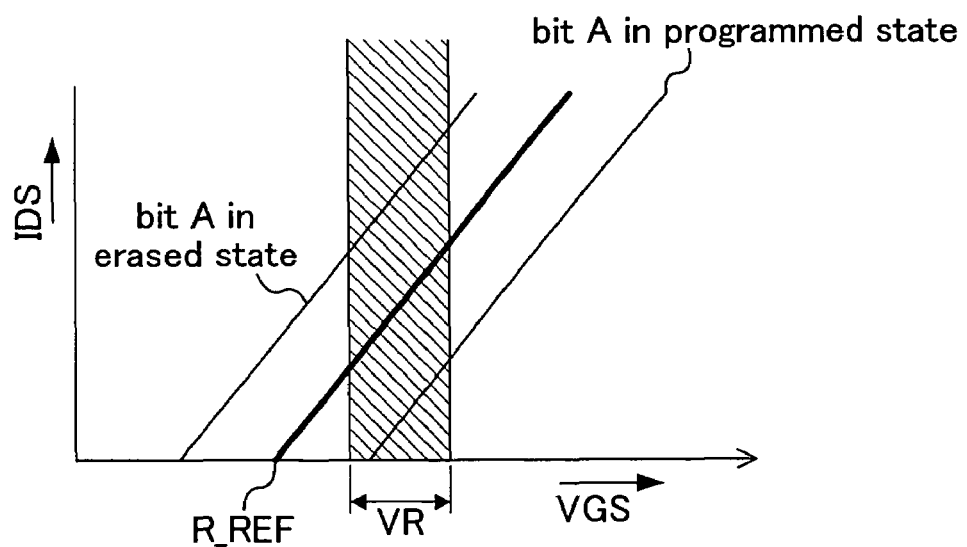
FIG. 3 is a diagram illustrating current characteristics of a memory cell in which a bit A is in an erased state, and current characteristics of a memory cell in which information is programmed.

FIG. 3 illustrates memory cell characteristics where the bit A and the bit B are initially erased, and thereafter, a program operation is performed with respect to the bit A, and thereafter, a read operation is performed with respect to the bit A. In FIG. 3, the horizontal axis indicates a gate-to-source voltage (control voltage VGS) which is applied between the drain/source region 1004 and the control gate electrode 1014 when bit information stored in the charge trapping region 1016 is read out, where the drain/source region 1004 is used as a source and the drain/source region 1006 is used as a drain. As the control voltage VGS, for example, a power source voltage (a voltage within a voltage range indicated with VR) is applied in a read operation.

The vertical axis of FIG. 3 indicates a drain-to-source current (channel current IDS) which flows from the drain/source region 1006 to the drain/source region 1004 under the above-described bias condition. The channel current IDS of the MOS transistor forms a quadric curve with respect to the control voltage VGS, but is represented by a straight line for the sake of simplicity.

Current characteristics of the memory cell in which the bit A is erased, and current characteristics of the memory cell in which information is programmed, are illustrated in FIG. 3. In order to read information of the bit A, a reference cell having the same structure as that of the memory cell is used to create a read reference current R_REF having characteristics as illustrated in FIG. 3, for example. Stored data can be read out by comparing a magnitude of the reference current R_REF and a magnitude of the memory cell current. If the reference current R_REF can be set to be at a middle between the memory cell current in the erased state and the memory cell current in the programmed state, a read operation margin can be maximized.

Figure 4:
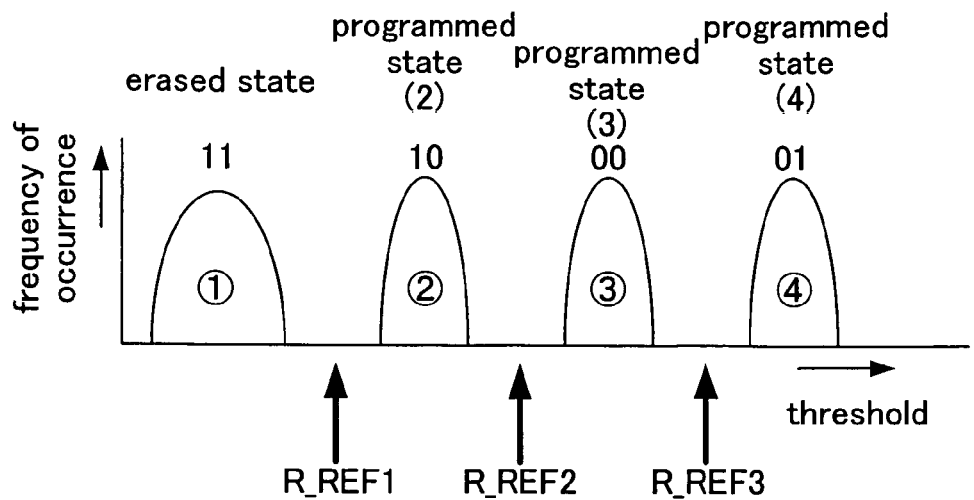
FIG. 4 is a diagram illustrating general threshold value distributions when 2-bit information is stored using four memory states (1) to (4).
Figure 5:
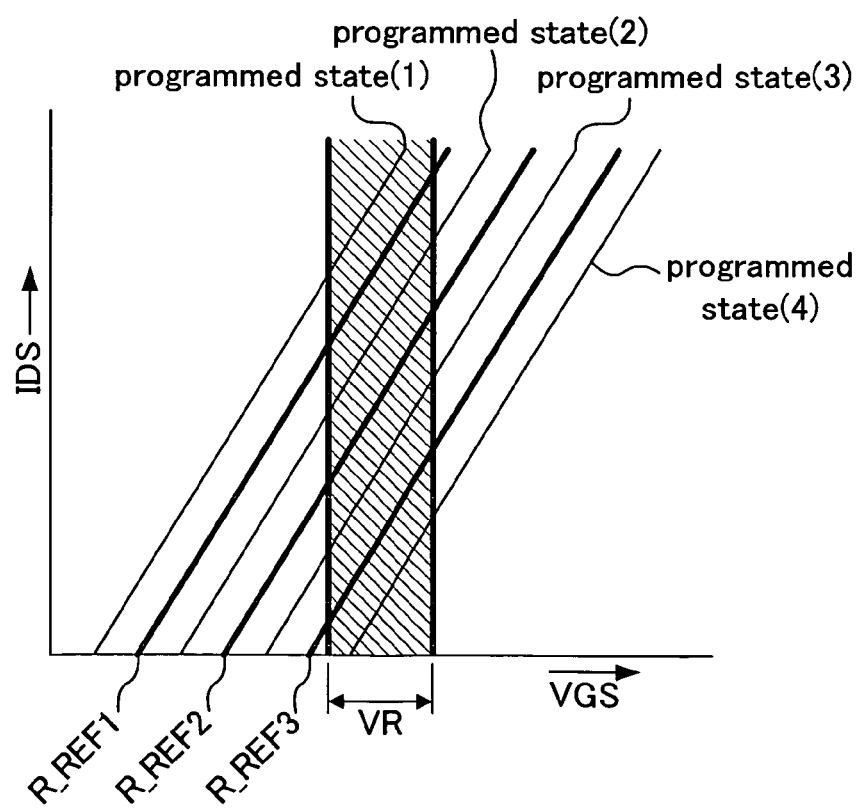
FIG. 5 is a diagram illustrating a relationship between current characteristics of a memory cell in each memory state and reference currents R_REF1 to R_REF3.

For example, if four memory states are achieved by causing the charge trapping regions 1016 and 1018 of the memory cell of FIG. 2 to trap charge to different levels, 2-bit information can be stored. In this embodiment, it is assumed that data "11" that the 2-bit data has two bits of "1" corresponds to a memory state (1) that the memory cell is in the erased state (electrons are not trapped), data "10" that the 2-bit data has a bit of "1" and a bit of "0" corresponds to a memory state (2) that the memory cell has a charge level 1, data "00" that the 2-bit data has two bits of "0" corresponds to a memory state (3) that the memory cell has a charge level 2, and data "01" that the 2-bit data has a bit of "0" and a bit of "1" corresponds to a memory state (4) that the memory cell has a charge level 3, and the charge levels have the following relationship: the level 1<the level 2<the level 3. FIG. 4 illustrates general threshold value distributions when 2-bit information is stored using the memory states (1) to (4). In order to read information from the memory cell storing the four states, three reference currents R_REF1 to R_REF3 which are provided at middles between the threshold value distributions of the four states are required. FIG. 5 illustrates a relationship between current characteristics of the memory cell in the memory states and the reference currents R_REF1 to R_REF3. In FIG. 5, the horizontal axis indicates the control voltage VGS and the vertical axis indicates the channel current IDS.

Figure 6:
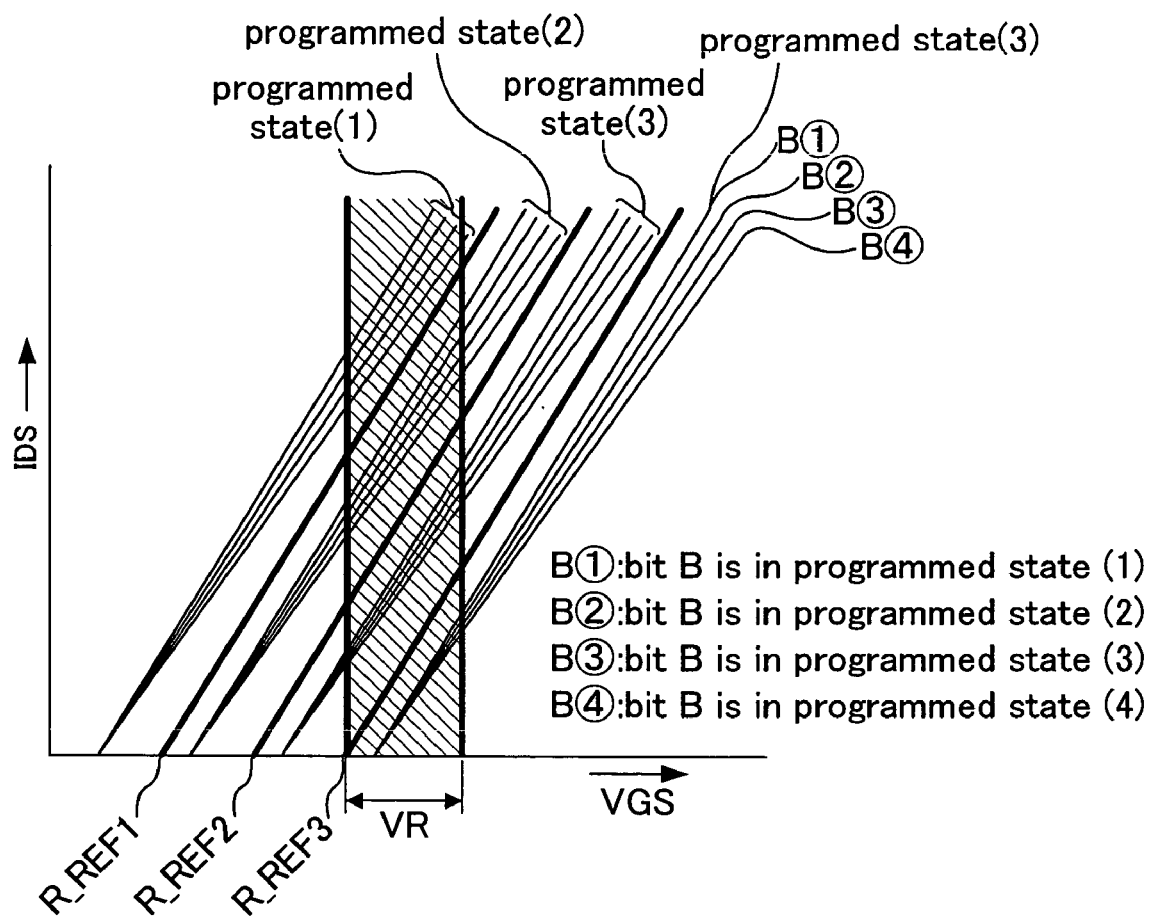
FIG. 6 is a diagram illustrating current characteristics of a memory cell in each memory state which is affected by an influence of the second bit effect.

In the MOS transistor 1000, when the charge trapping region 1016 is set into any one of the four states, and thereafter, a program operation is performed with respect to the charge trapping region 1018, there is an influence of the second bit effect, depending on the data of the charge trapping region 1018. For example, when the charge trapping region 1018 is in the memory state (1) (erased state), the influence of the second bit effect does not occur. When the charge trapping region 1018 is set to be in the memory state (2), the memory state (3), or the memory state (4), the current characteristics of the memory cell in each state vary due to the second bit effect as illustrated in FIG. 6.

A predetermined amount of charge is trapped in each of the reference cells 106 and 108 of the reference cell section 102, and the trapped charge is used for the current averaging circuit 104 to generate the reference currents R_REF1 to R_REF3 as described below. In this case, a reference cell setting section (not shown) having the above-described charge trapping circuit is provided to trap charge into the reference cells 106 and 108.

The current averaging circuit 104 outputs a current having an average value of a value of a current flowing through the reference cell 106 and a value of a current flowing through the reference cell 108, as the reference current R_REF1, R_REF2, or R_REF3 (described below). Specifically, the current averaging circuit 104 is composed of P-channel transistors 110, 112, and 114, N-channel transistors 116 and 118, and a drain voltage setting circuit 120. The P-channel transistors 110, 112, and 114 have the same size.

The drain voltage setting circuit 120 applies a bias of about 1 V to the drains of the reference cells 106 and 108. A current flowing when the bias is applied is supplied from the P-channel transistors 110, 112, and 114 to the drain voltage setting circuit 120.

In the reference current generating circuit 100, when the reference current R_REF1 is generated, a charge trapping region which is connected to the ground potential and is closer to the source (bit information stored in this region is referred to as a bit A in the reference current generating circuit 100) is set to be in a memory state (1) in the reference cell 106 and to be in a memory state (2) in the reference cell 108. A charge trapping region which is closer to the drain (bit information stored in this region is referred to as the bit B in the reference current generating circuit 100) is set to be in a memory state (4) in which the second bit effect is maximized, in the reference cell 106, and to be in the memory state (1) (erased state) in which the second bit effect is eliminated, in the reference cell 108. Note that, in FIG. 1 and the like, the memory states of the charge trapping regions of the reference cells are indicated by numbers enclosed with circles. For example, a portion having a circled number 1 indicates the memory state (1).

In the case of the above-described settings, the reference cell 106 is in a state equivalent to memory cell characteristics having a smallest current in the memory state (1) of the bit A. Also, the reference cell 108 is in a state equivalent to memory cell characteristics having a largest current in the memory state (2) of the bit A.

Next, when the drain voltage setting circuit 120 applies a bias of about 1 V to the drains of the reference cells 106 and 108 to supply a current from the P-channel transistors 110 and 112, which are diode-connected, to the reference cells 106 and 108, a sum of currents of the reference cell 106 and 108 is supplied from the P-channel transistors 110 and 112. Since the P-channel transistors 110 and 112 have the same size, the currents flowing through the P-channel transistors 110 and 112 are equal to each other, i.e., each of the currents is half of the sum of the currents of the reference cells 106 and 108. Since each of the P-channel transistors 110 and 112, and the P-channel transistor 114 which serves as a current mirror, have the same size, the P-channel transistor 114 supplies, to the N-channel transistor 116, a current equal to the current flowing through each of the P-channel transistors 110 and 112.

When the current of the P-channel transistor 114 is supplied to the N-channel transistor 116, a current equal to the current flowing through the N-channel transistor 116 flows through the N-channel transistor 118 which serves as a current mirror. The current value of the N-channel transistor 118 is half of the sum current value of the reference cells 106 and 108, and this current is set as the read the reference current R_REF1.

Figure 7:
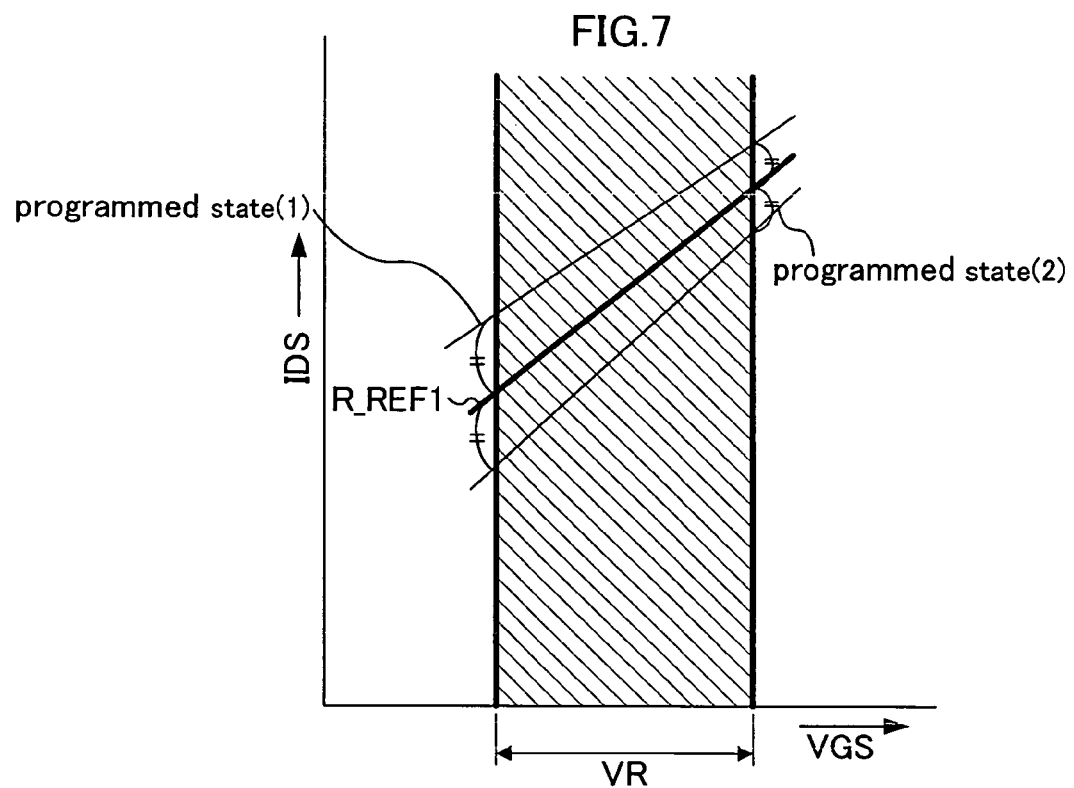
FIG. 7 is a diagram illustrating a relationship between current characteristics of a memory cell in memory states (1) and (2) and the reference current R_REF1.

In a read operation in which the reference current R_REF1 is used to determine the memory state (1) and the memory state (2) stored in the bit A, the memory state (1) which has a largest second bit effect and a smallest current value and the memory state (2) which does not have the influence of the second bit effect and has a largest current value need to be correctly determined as illustrated in FIG. 7.

As described above, according to the reference current generating circuit 100, as illustrated in FIG. 7, the reference current R_REF1 is set to be at a middle between the current values in the two memory states (1) and (2) no matter what value is taken by the applied control voltage.

Figure 8:
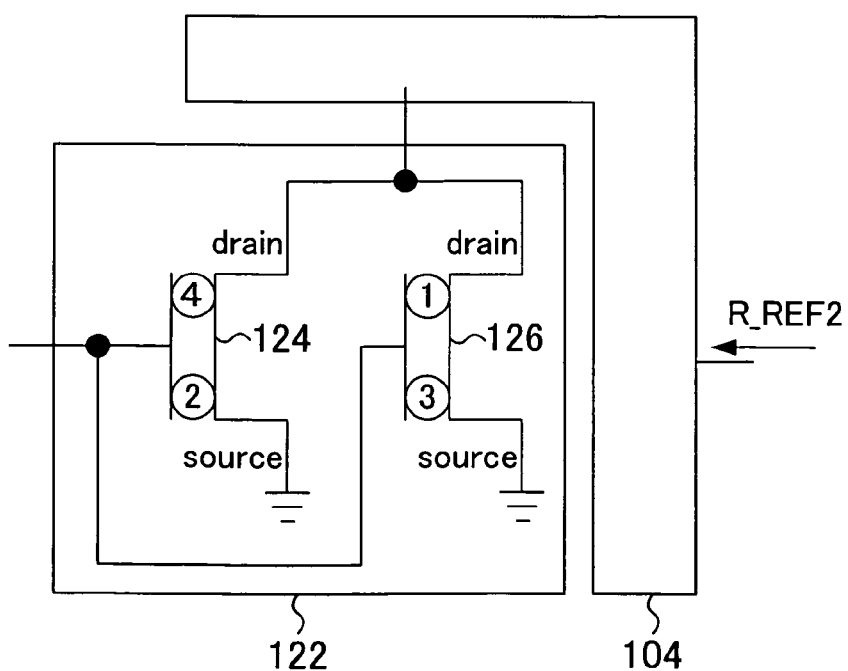
FIG. 8 is a block diagram illustrating a configuration of a reference current generating circuit which generates a reference current R_REF2.

The reference current R_REF2 for determining the memory state (2) and the memory state (3) is generated by a reference current generating circuit 128 illustrated in FIG. 8. The reference current generating circuit 128 is composed of a reference cell section 122 and a current averaging circuit 104. The reference current generating circuit 128 is a circuit equivalent to the reference current generating circuit 100.

In the reference current generating circuit 128, a reference cell state in the reference cell section 122 is set as illustrated in FIG. 8. Specifically, in the reference cell section 122, a charge trapping region which is closer to the source is set to be in the memory state (2) in a reference cell 124, and to be in the memory state (3) in a reference cell 126. Also, a charge trapping region which is closer to the drain is set to be in the memory state (4) in which the second bit effect is maximized, in the reference cell 124, and to be in the memory state (1) (erased state) in which the second bit effect is eliminated, in the reference cell 126.

Thereby, the reference cell 124 is caused to be in a state equivalent to memory cell characteristics having a smallest current in the memory state (2) of the bit A. Also, the reference cell 126 is caused to be in a state equivalent to memory cell characteristics having a largest current in the memory state (3) of the bit A.

The current averaging circuit 104 outputs the reference current R_REF2 having a current value which is half of a sum of currents of the reference cells 124 and 126. Therefore, the reference current can be set to be at a middle between the current values in the two memory states having different current characteristics no matter what value is taken by the applied control voltage.

Figure 9:
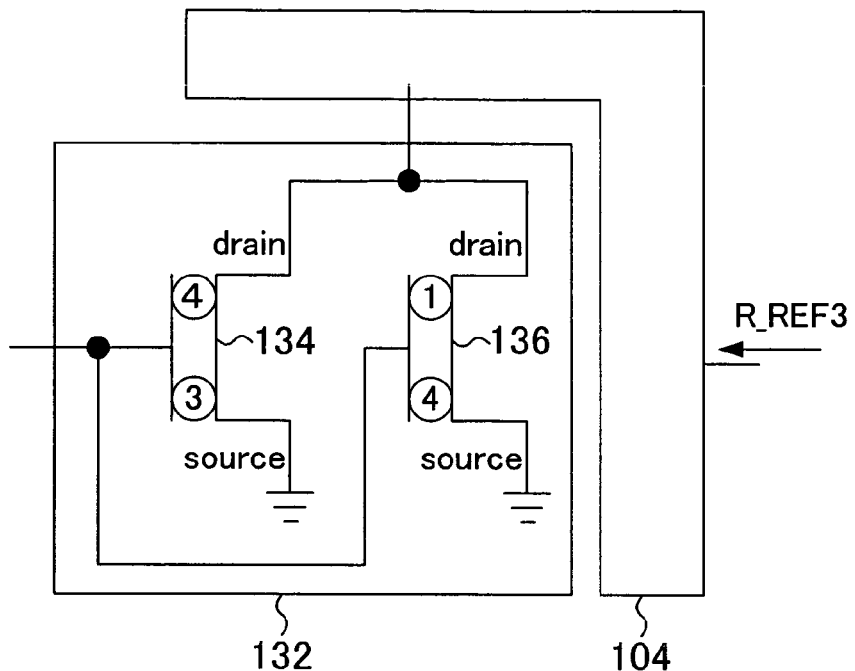
FIG. 9 is a block diagram illustrating a configuration of a reference current generating circuit which generates a reference current R_REF3.

The reference current R_REF3 for determining the memory state (3) and the memory state (4) is generated by a reference current generating circuit 130 illustrated in FIG. 9. The reference current generating circuit 130 is composed of a reference cell section 132 and a current averaging circuit 104. The reference current generating circuit 130 is a circuit equivalent to the reference current generating circuit 100.

In the reference current generating circuit 130, a reference cell state in the reference cell section 132 is set as illustrated in FIG. 9. Specifically, in the reference cell section 132, a charge trapping region which is closer to the source is set to be in the memory state (3) in a reference cell 134, and to be in the memory state (4) in a reference cell 136. Also, a charge trapping region which is closer to the drain is set to be in the memory state (4) in which the second bit effect is maximized, in the reference cell 134, and to be in the memory state (1) (erased state) in which the second bit effect is eliminated, in the reference cell 136.

The current averaging circuit 104 outputs the reference current R_REF3 having a current value which is half of a sum of currents of the reference cells 134 and 136. Therefore, the reference current can be set to be at a middle between the current values in the two memory states having different current characteristics no matter what value is taken by the applied control voltage.

As described above, according to this embodiment, even when the current characteristics of the memory cell vary due to the second bit effect, the reference current can be optimized so that a read operation margin is set to have an optimal value.

Note that, for example, in the reference cell section 102, a plurality of the reference cells 106 set to be in the same state (the reference cell 124 in the reference cell section 122, or the reference cell 134 in the reference cell section 132), and a plurality of the reference cells 108 set to be in the same state (the reference cell 124 in the reference cell section 122, or the reference cell 136 in the reference cell section 132) may be provided, and an average value of currents of these cells may be output as a reference current. Thereby, even when there are variations in the reference cells 106 and 108 due to the manufacturing process, the reference current can be set with higher accuracy.

Embodiment 2 of the Invention

In the reference current generating circuit 100 of Embodiment 1, a reduction itself in the read operation margin due to the influence of the second bit effect cannot be avoided. On the other hand, in Embodiment 2, the reduction of the read operation margin is minimized by adjusting a program level with respect to an information memory cell in a program operation.

Figure 10:
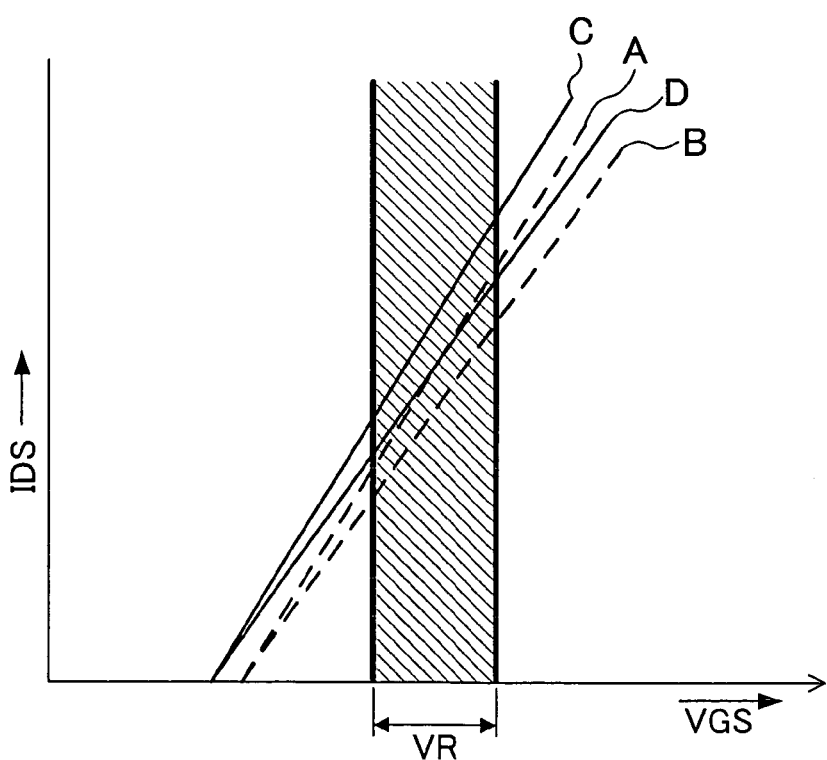
FIG. 10 is a diagram for explaining a program operation according to Embodiment 2 of the present invention.

FIG. 10 is a diagram for explaining a program operation according to Embodiment 2 of the present invention. In FIG. 10, characteristics A are current characteristics which are targeted in a state in which the second bit effect is not present.

For example, when a program operation is performed with respect to the charge trapping region 1016 (the bit A) using a level which achieves the characteristics A (target program level), the characteristics A vary depending on write data of the charge trapping region 1018 (the bit B) in which a program operation is performed later. When the variation is most significant, the characteristics A are changed to characteristics B illustrated in FIG. 10.

Therefore, a program operation is performed with respect to the bit A so that characteristics C are achieved after the program operation, by referencing the write data of the bit B with respect to which a program operation is performed later. Thereafter, when a program operation is performed with respect to the bit B, the bit A is affected by the second bit effect, so that the characteristics C are changed to, for example, characteristics D illustrated in FIG. 10.

When the four states of the bit A and the bit B are used to store two bits, an influence degree of the bit B with respect to which a program operation is performed later has four states. Therefore, depending on the four types of the write data of the bit B, the program level is changed into the respective types, and a program operation is performed with respect to the bit A. For example, when the bit B has data "01" and the influence of the second bit effect is largest, the program level of the bit A is set to achieve characteristics E. When the bit B has data "00" and the influence of the second bit effect is largest next to data "01", the program level of the bit A is set to achieve characteristics F. When the bit B has data "10" and the influence of the second bit effect is largest next to data "00", the program level of the bit A is set to achieve characteristics G. When the bit B has data "11" and the influence of the second bit effect is not present, the program level of the bit A is set to achieve characteristics H. When, after a program operation is performed with respect to the bit A in this manner, a program operation is performed with respect to the bit B, the characteristics of the bit A become characteristics I in each case. Specifically, a variation width can be minimized within the read voltage range of the control gate voltage VGS.

Figure 12:
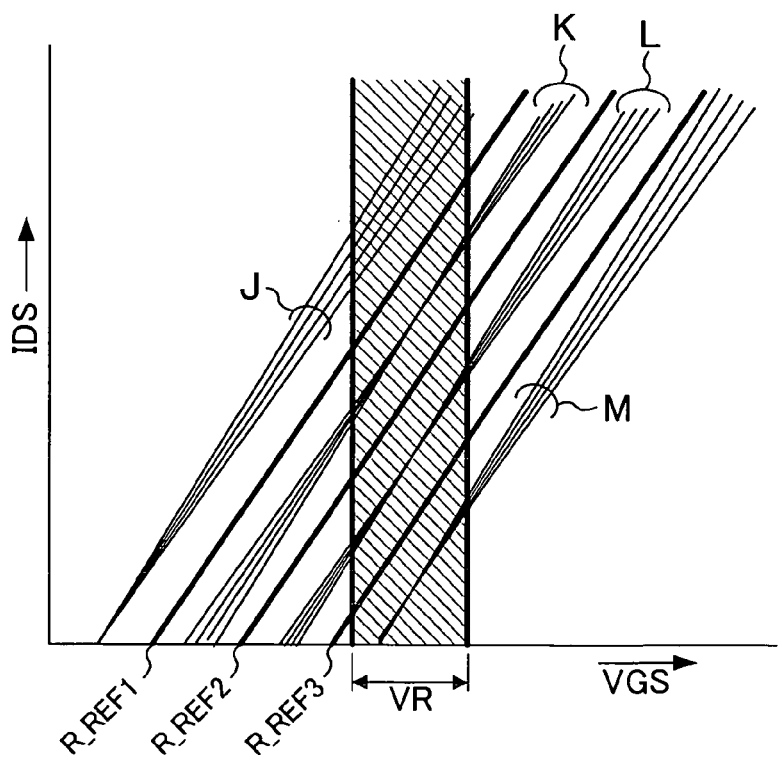
FIG. 12 is a diagram illustrating current characteristics of the bit A when a program level control is performed in a program operation with respect to the bit A, and thereafter, a program operation is performed with respect to the bit B.

FIG. 12 illustrates memory cell characteristics of the bit A when a program level control is performed with respect to all of the four types of write data in a program operation with respect to the bit A, depending on the write data of the bit B, and thereafter, a program operation is performed with respect to the bit B.

When the bit A is in a memory state K, a memory state L, and a memory state M, except for a memory state J (erased state), a variation in characteristics can be minimized within a read voltage range VR of the control gate voltage VGS by the above-described program level control of the bit A. Note that, in the memory state J (erased state) of the bit A, the level control cannot be performed, since the write data of the bit B is uncertain in an erase operation. Therefore, the influence of the second bit effect cannot be reduced, so that the variation width cannot be suppressed as illustrated in FIG. 12.

As described above, according to this embodiment, by controlling the program level so that the memory states are equally spaced after a program operation is performed with respect to the bit B, it is possible to reduce the influence of the second bit effect and suppress a reduction in the read operation margin.

Note that the above-described program level control can be achieved by, for example, switching verification reference currents in a write verification operation which determinines whether or not a program operation reaches a target level. A specific configuration will be described in Embodiment 3.

Embodiment 3 of the Invention

Figure 13:
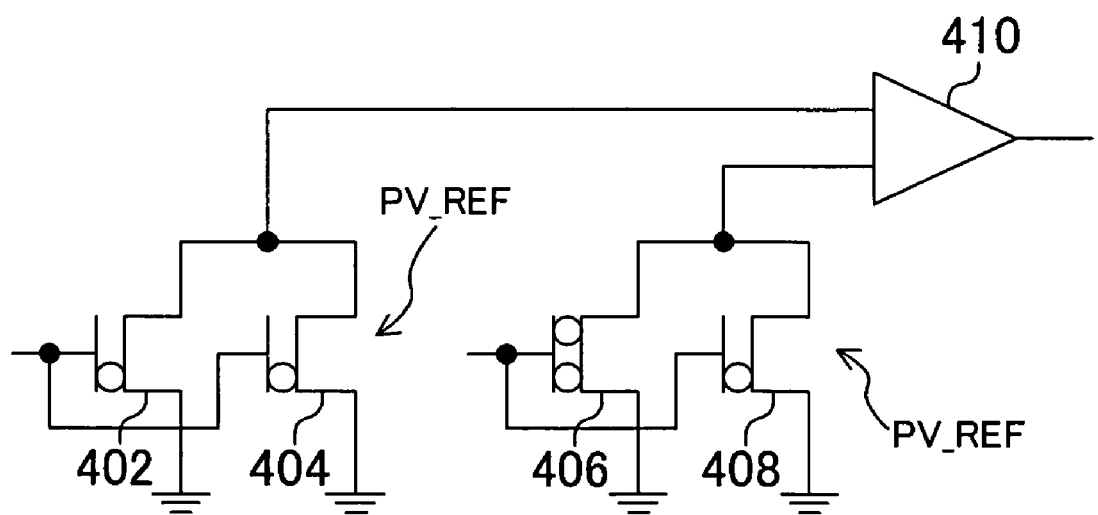
FIG. 13 is a block diagram illustrating a configuration of a verification reference current generating circuit according to Embodiment 2 of the present invention.

A circuit which generates the verification reference current will be described as Embodiment 3. A verification reference current generating circuit 400 illustrated in FIG. 13 is composed of a write verification reference cells 402 to 408 and a comparison circuit 410.

The reference cells 402 to 408 are each composed of a MONOS memory cell having the same structure as that of an information memory cell. In the verification reference current generating circuit 400, a write verification reference current is generated, depending on charge trapped with respect to the reference cells 402 to 408. Note that, in the reference cells 402 to 408, a verification reference setting section (not shown) having the charge trapping circuit is provided so as to trap charge.

The comparison circuit 410 compares a sum of current values of the reference cells 402 and 404 with a sum of current values of the reference cells 406 and 408.

A plurality of types of write verification reference currents are required. Therefore, in the verification reference current generating circuit 400, the four reference cells 402, 404, 406, and 408 are used so as to generate two types of write verification reference currents.

Hereinafter, an example in which the verification reference current generating circuit 400 generates two types of write verification reference currents so as to set an information memory cell to have the characteristics H or the characteristics G of FIG. 11, will be described. Here, in the reference cell 402 and the like, a charge trapping region with respect to which a program operation has been performed is indicated with a circle as illustrated in, for example, FIG. 14 and the like.

Figure 14:
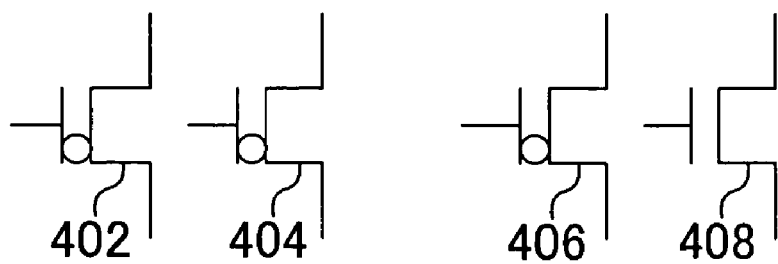
FIG. 14 is a diagram illustrating a charge trapped state of a reference cell in Embodiment 3.
Figure 15:
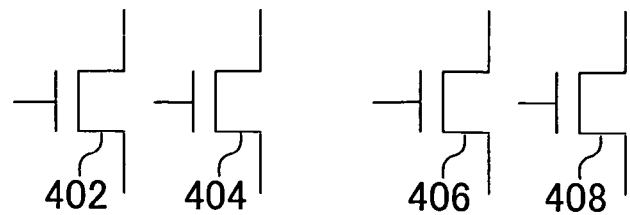
FIG. 15 is a diagram illustrating a charge trapped state (erased state) of a reference cell in Embodiment 3.

Initially, as illustrated in FIG. 15, all of the charge trapping regions in all of the reference cells 402 to 406 are assumed to be in the erased state. Next, as illustrated in FIG. 14, a program operation is performed with respect to one of the charge trapping regions in each of the reference cells 402, 404, and 406. In this state, in the reference cells 402, 404, and 406, a reference current for setting a program level is set so that an information memory cell is set to have the characteristics H of FIG. 11.

Figure 16:
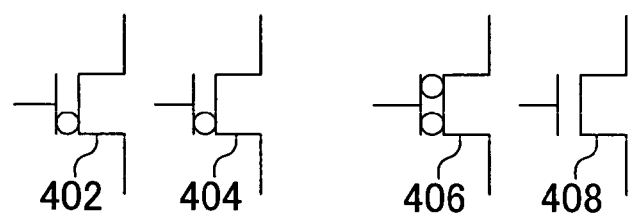
FIG. 16 is a diagram illustrating a charge trapped state of a reference cell in Embodiment 3.

Next, as illustrated in FIG. 16, a program operation is performed with respect to the other charge trapping region in the reference cell 406 so as to achieve the characteristics H. In this case, the write verification reference can be set to be a program level using the reference cell 402 or 404 which is set as illustrated in FIG. 14.

Thus, since a program operation is performed with respect to the other charge trapping region in the reference cell 406, a cell current of the reference cell 406 has a reduced value compared to those of the reference cells 402 and 404 due to the influence of the second bit effect.

Following this, a program operation is performed with respect to one of the charge trapping regions of the reference cell 408 so that a sum of currents of the reference cells 402 and 404 and a sum of currents of the reference cells 406 and 408 are equal to each other, while comparing these sum currents in the comparison circuit 410.

If the state of the reference cell 408 is set so that the sum current of the reference cells 406 and 408 and the sum current of the reference cells 402 and 404 are equal to each other, the reference cell 408 is set to have a larger current than those of the reference cells 402 and 404 so as to compensate for a reduction in the current of the reference cell 406 due to the second bit effect. Therefore, by performing a program operation with respect to an information memory cell using a current flowing through the reference cell 408 as a write verification reference current, the program operation can achieve the characteristics G of FIG. 11.

Note that the circuit for setting the state of the reference cell 408 is not limited to the above-described circuit configuration. For example, one of the two reference cells 402 and 404 is used to set the program level of the reference cell 408 so that a current doubled by a multiplication circuit is equal to the sum current of the reference cells 406 and 408, thereby making it possible to achieve a similar effect.

Figure 11:
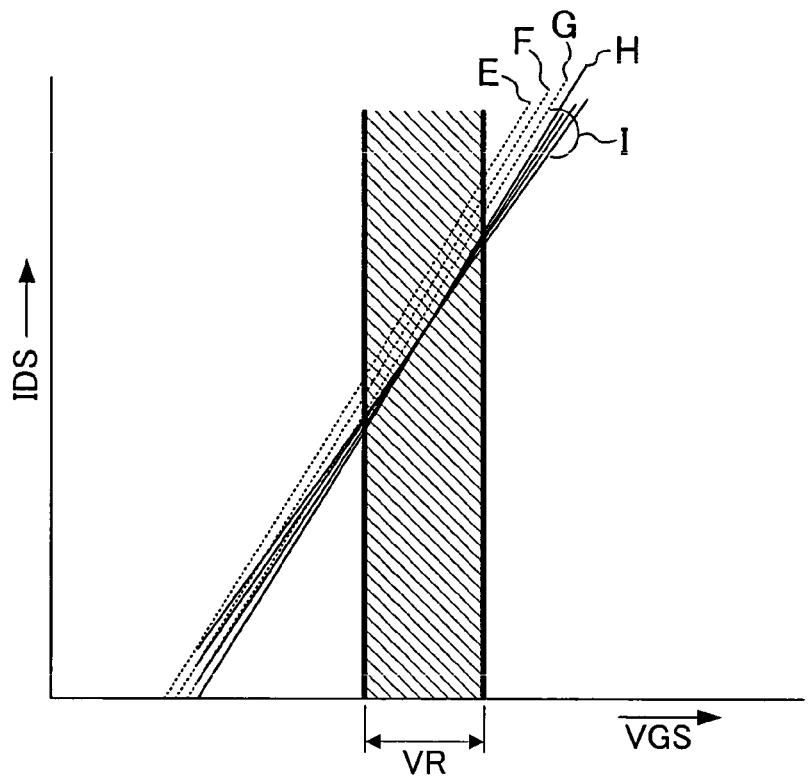
FIG. 11 is a diagram illustrating current characteristics of a bit A which is written using a program level which varies depending on four types of write data of a bit B.

In order to perform a program operation which achieves the read characteristics of FIG. 11, write verification reference currents for setting the characteristics E and the characteristics F further need to be set.

For this purpose, two additional pairs of reference cells corresponding to the reference cells 406 and 408 are used. A program operation is performed with respect to a reference cell corresponding to the reference cell 408 of FIG. 13 under a condition which causes the program level with respect to the other charge trapping region of a reference cell corresponding to the reference cell 406 to be different. By setting four types of write verification reference currents in this manner, program states which achieve the memory cell characteristics E, F, G, and H of FIG. 11 can be set.

In addition, in order to set the four memory states of FIG. 12, four types of write verification reference currents are set for each of the three types of memory states K, L, and M, and a write verification reference current is selected by referencing the write data of the bit B when data is written into the bit A. Thereby, it is possible to achieve writing of the characteristics of FIG. 12.

As described above, according to this embodiment, in the case of setting of the write verification reference current, the program level of a write verification reference cell is set so as to compensate for a variation which actually occurs due to the second bit effect when the reference current is set. Thereby, it is possible to set a write verification reference cell for compensating for the second bit effect when the bit A is written, with high accuracy.

Variation of Embodiment 3 of the Invention

Figure 17:
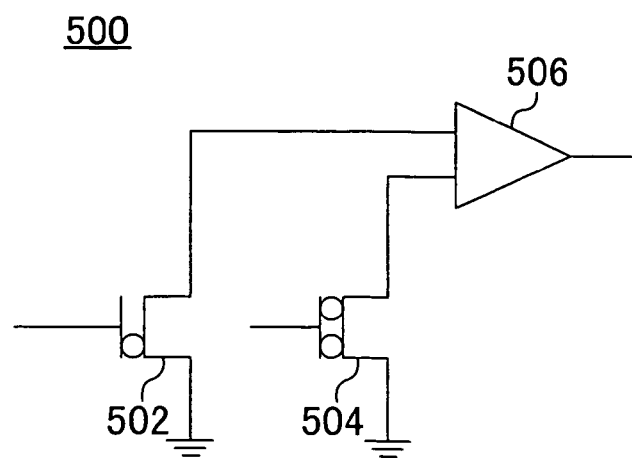
FIG. 17 is a block diagram illustrating a verification reference current generating circuit according to a variation of Embodiment 3 of the present invention.

A verification reference current generating circuit 500 which has a circuit configuration simpler than that of the verification reference current generating circuit 400 but can set a write verification reference current, will be described. As illustrated in FIG. 17, the verification reference current generating circuit 500 is composed of write verification reference cells 502 and 504 and a comparison circuit 506.

The reference cells 502 and 504 are each a MONOS memory cell having the same configuration as that of an information memory cell.

The comparison circuit 506 compares a current value of the reference cell 502 with a current value of the reference cell 504.

Hereinafter, a write verification reference current setting method for setting the characteristics H and the characteristics G of FIG. 11 in the verification reference current generating circuit 500 will be described as an example.

Figure 18:
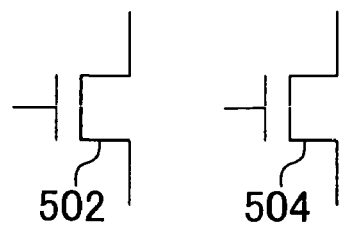
FIG. 18 is a diagram illustrating a charge trapped state (erased state) of a reference cell in the variation of Embodiment 3.
Figure 19:
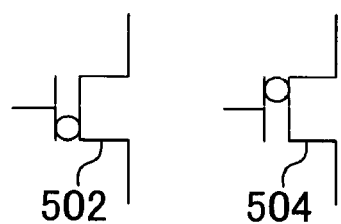
FIG. 19 is a diagram illustrating a charge trapped state of a reference cell in the variation of Embodiment 3.

Initially, all of the charge trapping regions of both the reference cells 502 and 504 are assumed to be in the erased state (see FIG. 18). Next, as illustrated in FIG. 19, a program operation which has the characteristics H of FIG. 11 is performed with respect to a charge trapping region of the reference cell 502 which is closer to the source, and at the same time, a program operation which causes the characteristics H is similarly performed with respect to a charge trapping region of the reference cell 504 which is closer to the drain, thereby causing the second bit effect.

Figure 20:
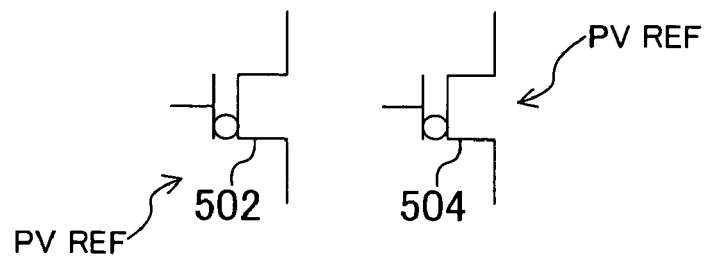
FIG. 20 is a diagram illustrating a charge trapped state of a reference cell in the variation of Embodiment 3.

Next, as illustrated in FIG. 17, a program operation is performed with respect to the source-side charge trapping region of the reference cell 504 while using the comparison circuit 506 to compare a cell current when reading the source-side charge trapping region of the reference cell 502 with a cell current when reading the source-side charge trapping region of the reference cell 504 with respect to whose drain-side charge trapping region a program operation has been performed, so as to cause these cell currents to be equal to each other. After setting the cell currents of the reference cells 502 and 504 to be equal to each other as illustrated in FIG. 20, data written in the drain-side charge trapping region of the reference cell 504 is erased.

By setting the states of the reference cells 502 and 504 in this manner, a write verification reference current for setting the characteristics H of FIG. 11 is set in the reference cell 502. For the reference cell 504, a current which is larger than that of the reference cell 502 by a current amount equivalent to a reduction in the current amount due to the second bit effect, can be set. In other words, a write verification reference current for setting the characteristics G of FIG. 11 is set.

In order to perform the program operation of FIG. 11, it is further necessary to set write verification reference currents for setting the characteristics E and the characteristics F. For this purpose, two additional reference cells corresponding to the reference cell 407 of FIG. 17 are used, and a program operation is performed with respect to the drain-side charge trapping region of a reference cell corresponding to the reference cell 504 of FIG. 13 under a condition that program levels with respect to the drain-side charge trapping region are different from each other. Thereafter, a program operation is performed with respect to the source-side charge trapping region of the reference cell corresponding to the reference cell 504 while performing a comparison in the comparison circuit 506, and an erase operation is performed with respect to the drain-side charge trapping region of the reference cell corresponding to the reference cell 504 of FIG. 20.

By setting the four types of write verification reference currents in this manner, the characteristics I can be achieved as characteristics in one programmed state of FIG. 11. In order to set the four states of FIG. 12, the four types of write verification reference currents are set in each of the three types of memory states K, L, and M, and when writing data into the bit A, a write verification reference current is selected by referencing the write data of the bit B. Thereby, it is possible to achieve a program operation which causes the characteristics of FIG. 12.

As described above, according to this variation, it is possible to set a write verification reference cell which corrects the second bit effect when a program operation is performed with respect to the bit A using a small number of reference cells.

Note that, in the verification reference current generating circuit 400 and the verification reference current generating circuit 500, a plurality of reference cells which are set to be in the same state, may be used, and a write verification reference current may be an average of the plurality of reference cells. Thereby, similar to setting of the above-described read reference current, a reference current can be set with higher accuracy, taking into a variation during the manufacturing process into consideration.

Embodiment 4 of the Invention

Figure 21:
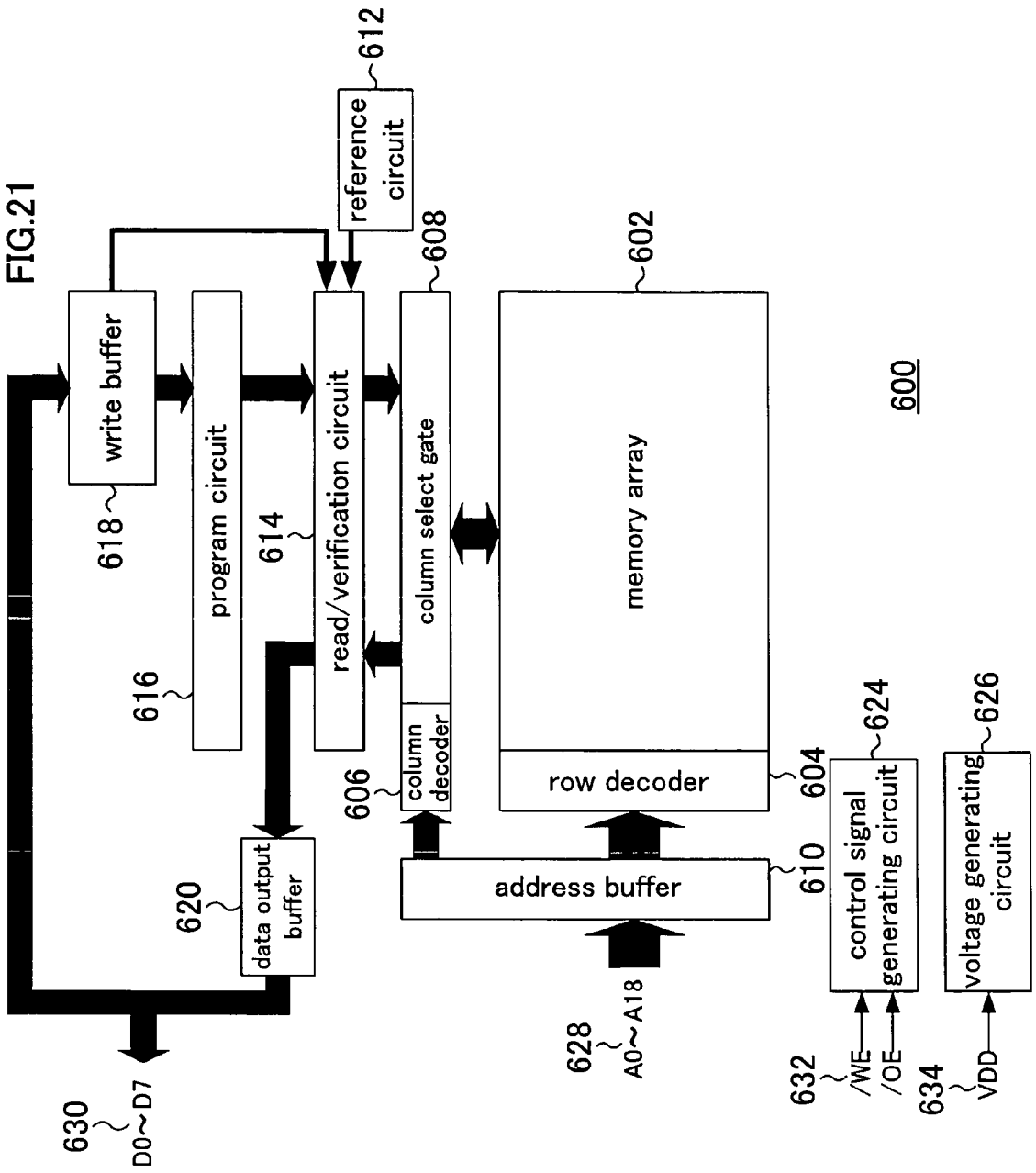
FIG. 21 is a block diagram illustrating an exemplary configuration of a flash memory according to Embodiment 4 of the present invention.

FIG. 21 is a block diagram illustrating an exemplary configuration of a flash memory 600 according to Embodiment 4 of the present invention. In FIG. 21, 602 indicates a memory cell array in which MONOS memory cells are arranged in an array, 610 indicates an address buffer which receives an address input through an address input terminal 628, and 604 indicates a row decoder which receives a row address output from the address buffer 610 and selects a specific word line in the memory cell array 602. 606 indicates a column decoder which receives a column address output from the address buffer 610 and outputs a select signal to a column select gate 608 for selecting a bit line. 612 indicates a reference circuit composed of the reference current generating circuit 100 of Embodiment 1 and the verification reference current generating circuit 400 of Embodiment 3 (or the verification reference current generating circuit 500).

In a data read operation, a read current of a memory cell connected to a bit line selected by the column select gate 608 is compared with a read reference current of the reference circuit 612 by a determination circuit 704 (described below) in a read/verification circuit 614. A result of the comparison is output via a data output buffer 620 to a data input/output terminal 630.

In a data program operation, data input through the data input/output terminal 630 is received by a write buffer 618. The write buffer 618 has a memory capacity of holding a data amount larger than that of data which can be written in the memory cell array 602 at once. An output of the write buffer 618 is written via the column select gate 608 into a memory cell by a program circuit 616. In a write verification operation, a read current of a memory cell is compared with a write verification reference current output by the reference circuit 612 by the determination circuit 704 in the read/verification circuit 614. Until a result of this comparison matches write data from the write buffer, a program operation and a write verification operation are repeated. When there is a match, the program operation is completed.

632 indicates a control signal input terminal for controlling an operation mode of a flash memory. A control signal generating circuit 624 receives a signal through the control signal input terminal 632 and generates various control signals for performing controls inside the flash memory in accordance with the operation mode. 626 indicates a voltage generating circuit which generates, based on a voltage through a power source voltage input terminal 634, a voltage which is required for an internal circuit of the flash memory in accordance with the operation mode.

As described above, a memory cell used in the present invention has the second bit effect. Specifically, memory cell characteristics of a charge trapping region (the bit A) with respect to which a program operation has been performed earlier, vary due to an influence of a charge trapping region (the bit B) with respect to which a program operation is performed later. A program operation in the flash memory 600 which is performed with respect to the bit A while a reduction in the read operation margin is minimized, taking into the variation due to the second bit effect, will be hereinafter described.

Figure 22:
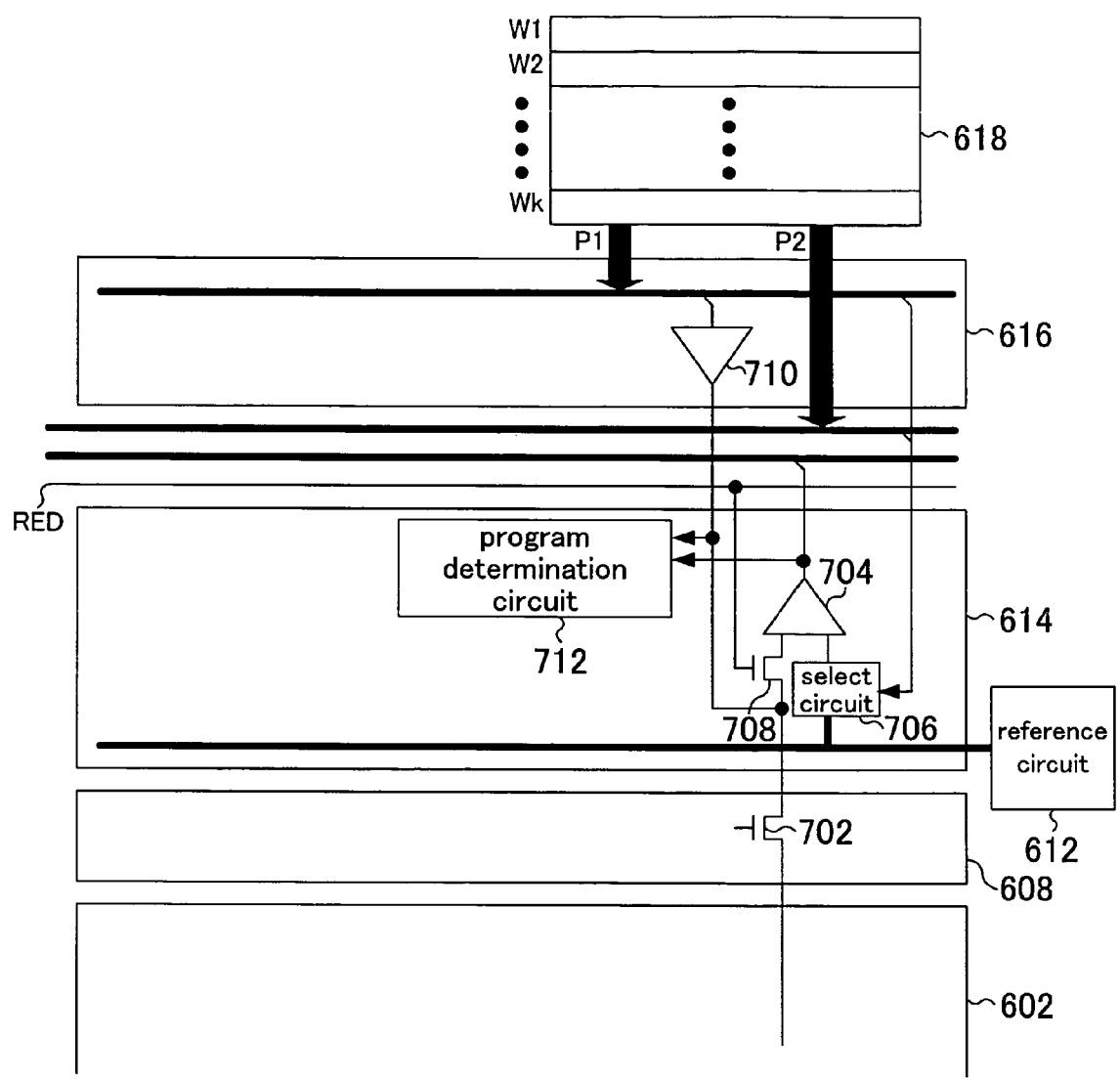
FIG. 22 is a block diagram illustrating a more detailed exemplary configuration of a column select gate, a read/verification circuit, a program circuit, and a write buffer.

FIG. 22 illustrates an exemplary circuit configuration for more specifically explaining the column select gate 608, the read/verification circuit 614, the program circuit 616, and the write buffer 618. The write buffer 618 is used to store data in an amount which is larger than the number of bits which can be simultaneously written into the memory cell array 602 in a single program operation. The write buffer 618 is a commonly used buffer for reducing a time required to switch internal potentials between a program operation and a write verification operation by performing the switching in units of a plurality of write addresses, but not in units of each write address, during a program operation with respect to the memory cell array 602.

Write data held in the write buffer 618 are mapped to addresses so that the data is written into two charge trapping regions in the same memory cell. When a program operation is performed with respect to a memory cell, write data is output from the write buffer 618 to a port 1 (P1). Thereafter, a write voltage is applied by a write amplifier 710 in the program circuit 616, via a gate 702 in the column select gate 608, to one of the charge trapping regions of a selected memory cell in the memory cell array 602 so as to writing the data. In this case, a read gate 708 in the read/verification circuit 614 is controlled using a control signal RED to be cut off.

In a write verification operation, by the control of the control signal RED, the read gate 708 in the read/verification circuit 614 is caused to be conductive, so that read data of a memory cell is supplied via the read gate 708 to one input of the determination circuit 704. The write verification reference current from the reference circuit 612 is selected and supplied by a select circuit into the other input of the determination circuit 704. When data to be written into one charge trapping region of a selected memory cell is output to the port 1 (P1), data to be written into the other charge trapping region of the selected memory cell is output to a port 2 (P2). Such a configuration is achieved by configuring the write buffer 618 using a 2-port memory, and setting addresses which are provided to the two ports to be the charge trapping regions of the memory cell.

Therefore, a write verification reference current selected in a write verification operation can be selected based on data to be written into one charge trapping region of a memory cell and data to be written later into the other charge trapping region of the same memory cell. 712 in the read/verification circuit 614 indicates a program determination circuit which detects a match between write data and an output of the determination circuit 704, and when there is a match, outputs a signal for completing a program operation.

Figure 23:
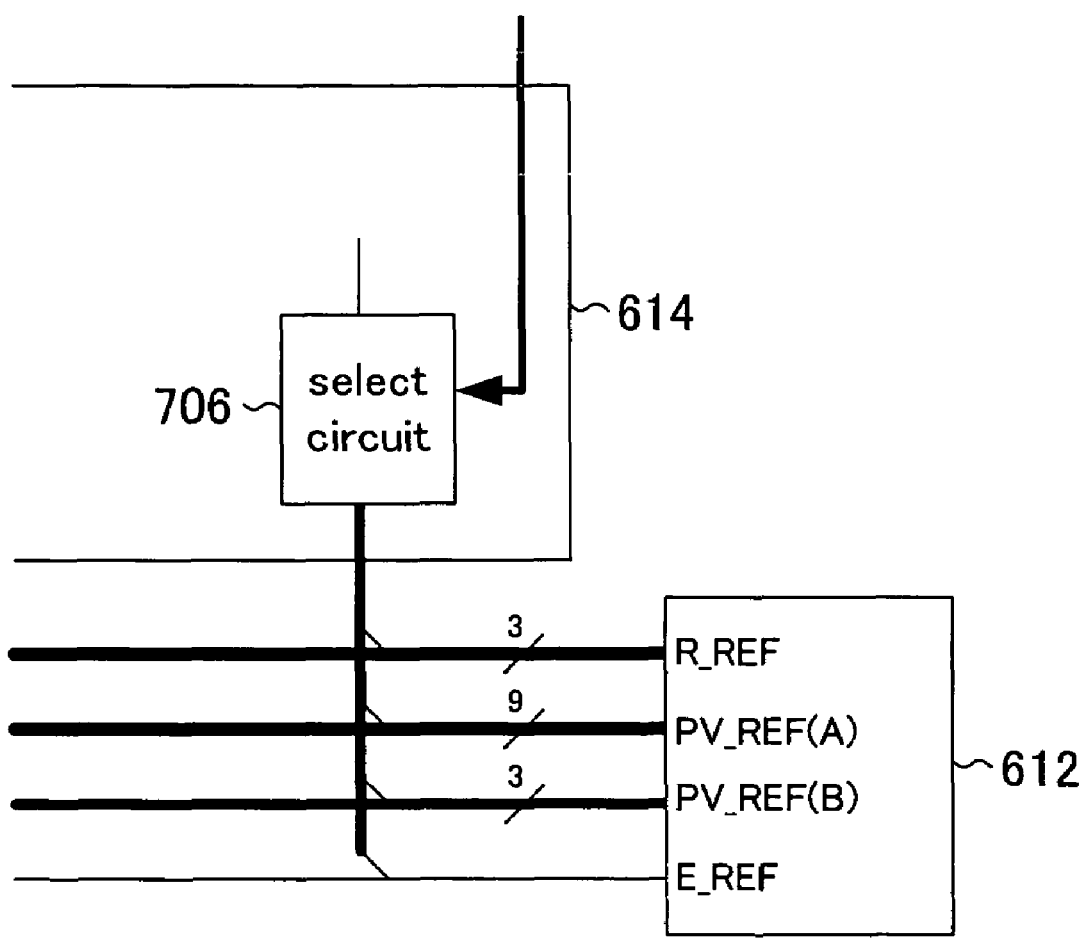
FIG. 23 is a diagram illustrating types of reference currents output from reference circuits.

FIG. 23 is a diagram for explaining types of reference currents output from the reference circuit 612 and an operation of a select circuit 706. When two bits are stored using four states into each of two charge trapping regions of a memory cell, three types of references for determining the four states (read references R_REF), one type of reference (erase verification reference E_REF), nine types of references with respect to the bit A which is one of the two charge trapping regions of the memory cell with respect to which a program operation is performed earlier (write verification references PV_REF(A)), and three references with respect to the bit B which is the other charge trapping region of the memory cell with respect to which a program operation is performed later (write verification references PV_REF(B)), are output from the drain voltage setting circuit 120, and are selected and output to the determination circuit by the select circuit 706 in accordance with each operation mode.

The nine types of write verification references PV_REF(A) with respect to the bit A are set by, for example, the verification reference current generating circuit 400 or the verification reference current generating circuit 500.

With the above-described configuration, when two bits are stored into each of two charge trapping regions of a memory cell using the four states, memory cell characteristics of FIG. 12 can be achieved. By setting the reference currents R_REF1 to R_REF3 as illustrated in FIG. 12, it is possible to achieve a stable read operation having a large read operation margin.

As can be seen from FIG. 12, in the memory state M which has a deepest program level in the bit A, the current value is small within the read voltage range of the control gate. Therefore, when the bit A is written into the memory state M, the influence of the second bit effect has a small value in a read operation.

Figure 24:
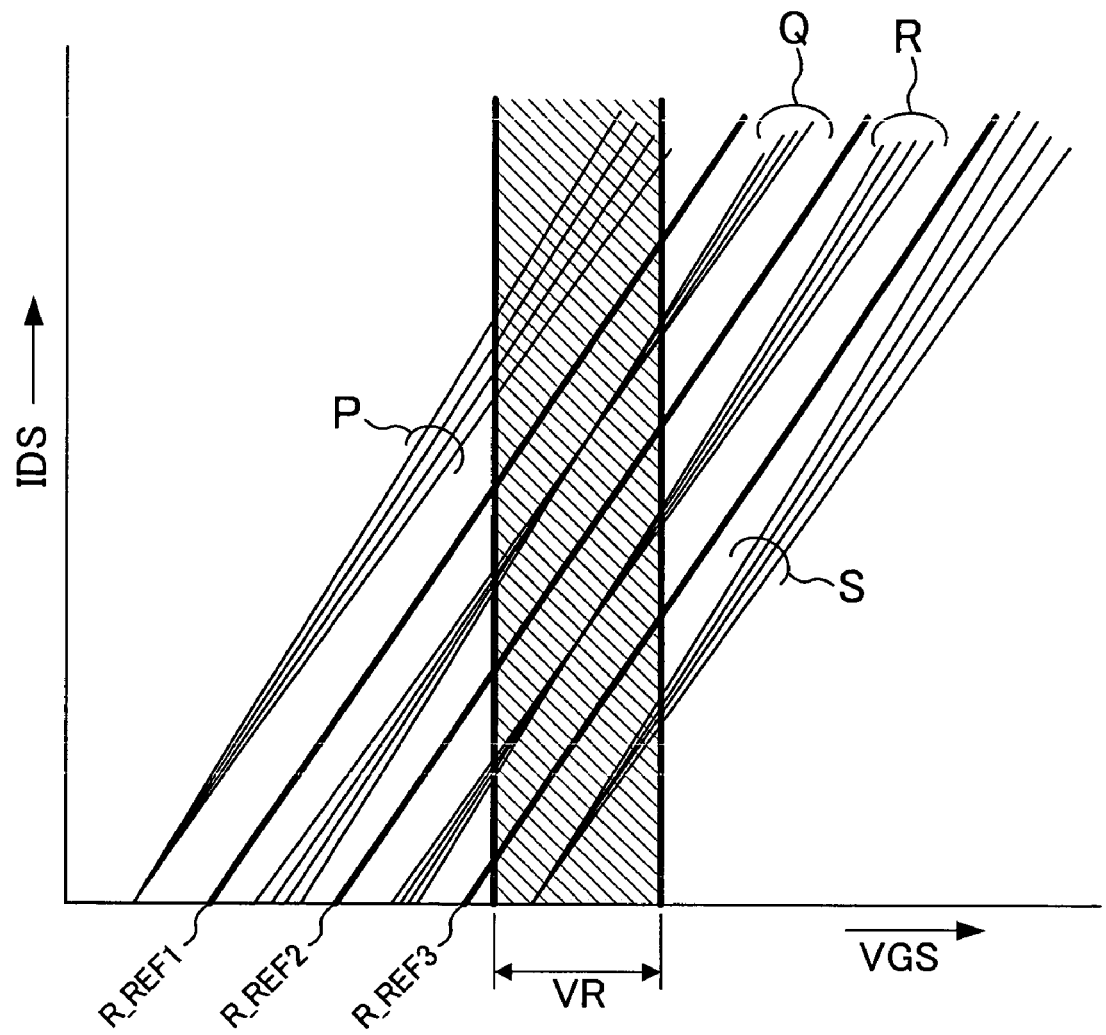
FIG. 24 is a diagram illustrating read characteristics of a bit A when the second bit effect is not corrected.

FIG. 24 illustrates read characteristics of the bit A when the second bit effect is not corrected, assuming that a write verification reference current has a constant value (single program level) when the bit A is written into the memory state M. The memory state M of the bit A has characteristics S as illustrated in FIG. 24, resulting in a less influence on the read characteristics. Therefore, by performing such a control, a similar effect can be achieved with a reduced number of write verification reference currents. In this case, the number of write references P_REF(A) with respect to the bit A, which is set in the select circuit 706, is decreased. The configuration of FIG. 24 is the same as that of FIGS. 21 to 23, except that the number of signal lines for selecting references is reduced by the select circuit 706.

As described above, the non-volatile semiconductor memory device of the present invention has an effect that a reference current can be optimized, thereby making it possible to optimize a read operation margin, even when current characteristics of a memory cell vary due to the second bit effect, and the like. The non-volatile semiconductor memory device of the present invention is useful as a non-volatile semiconductor memory device which has memory cells each composed of a MOS transistor having a charge trapping layer in a gate dielectric layer and stores a plurality of pieces of information using charge trapping regions different from each other in the charge trapping layer, and the like.

What is claimed is:

1. A non-volatile semiconductor memory device comprising:
   a memory cell composed of a transistor having a charge trapping layer in a gate dielectric layer, in which charge is trapped in a first charge trapping region and a second charge trapping region, which are different from each other, in the charge trapping layer, and information is stored in each charge trapping region, depending on a trapped charge level;
   a plurality of read reference cells having the same structure as that of the memory cell and including a first read reference cell and a second read reference cell;
   a read reference cell setting section of setting a first charge trapping region of the first read reference cell into a first state in which a first charge amount is trapped, setting a second charge trapping region of the first read reference cell into a second state in which a second charge amount is trapped, setting a first charge trapping region of the second read reference cell into a third state in which a third charge amount larger than the first charge amount is trapped, and setting a second charge trapping region of the second read reference cell into a fourth state in which a fourth charge amount smaller than the second charge amount is trapped; and
   a reference information output section of outputting combination information of first information which is accumulation information about the first charge trapping region of the first read reference cell and second information which is accumulation information about the first charge trapping region of the second read reference cell, as a read reference which is used as a reference when information is read from the memory cell,
   wherein an absolute value of a difference between the first charge amount and the third charge amount is different from that of a difference between the second charge amount and the fourth charge amount.

2. The non-volatile semiconductor memory device of claim 1, wherein a plurality of the first read reference cells and a plurality of the second read reference cells are provided, and
   the read reference cell setting section is configured to perform the setting with respect to a plurality of first read reference cells and a plurality of second read reference cells.

3. The non-volatile semiconductor memory device of claim 1, wherein the first information and the second information are a read current value of the first read reference cell and a read current value of the second read reference cell, respectively, and
   the combination information is an average value of a read current value of the first read reference cell and a read current value of the second read reference cell.

4. The non-volatile semiconductor memory device of claim 2, wherein the first information and the second information are a read current value of the first read reference cell and a read current value of the second read reference cell, respectively, and
   the combination information is an average value of read current values of a plurality of first read reference cells and read current values of a plurality of second read reference cells.

5. A non-volatile semiconductor memory device comprising:
   a memory cell array having memory cells arranged in an array, each memory cell being composed of a transistor having a charge trapping layer in a gate dielectric layer, in which charge is trapped in a first charge trapping region and a second charge trapping region, which are different from each other, in the charge trapping layer, so that information is stored in each charge trapping region;
   a write information buffer of holding information to be programmed into the memory cell array;
   a write section of writing the information held by the write information buffer into the first charge trapping region;
   a program level control section of performing a control so that the write section performs writing until a charge amount trapped in the first charge trapping region reaches a set level; and
   a plurality of write verification reference cells each having the same structure as that of the memory cell in which a write verification reference is set, the write verification reference being a reference for a charge level to be trapped when information is programmed into the first charge trapping region or the second charge trapping region of the memory cell;
   a verification reference setting section of setting a plurality of write verification references having different levels into the write verification reference cells with respect to the same type of information;
   a verification section of performing write verification using one write verification reference selected from the plurality of write verification references in a write verification operation performed after writing of information; and
   in a program operation into the first charge trapping region which is performed in advance of a program operation into the second charge trapping region, a level switching section of switching the set level with respect to the same type of information into a plurality of levels, depending on information to be programmed into the second charge trapping region.

6. The non-volatile semiconductor memory device of claim 5, wherein the write information buffer has a memory capacity of holding an information amount larger than an information amount which can be programmed into the memory cell array at once.

7. The non-volatile semiconductor memory device of claim 5, wherein the level switching section has a section of reading data to be written into the second charge trapping region, from the write information buffer, when information is programmed into the first charge trapping region.

8. The non-volatile semiconductor memory device of claim 5, wherein the level switching section is configured not to perform the switching when information corresponding to a smallest charge level is programmed into the first charge trapping region, and
   the program level control section is configured to perform a control so that the write section performs writing until a fixedly determined set level is reached, when information corresponding to a smallest charge level is programmed into the first charge trapping region.

9. The non-volatile semiconductor memory device of claim 5, wherein the verification reference setting section is configured to:
   trap a target program level of charge into a first charge trapping region of a first write verification reference cell and a first charge trapping region of a second write verification reference cell;
   trap a target program level of charge into a second charge trapping region of the first write verification reference cell; and
   perform writing with respect to a first charge trapping region of a third write verification reference cell so that a sum of a read current of the first charge trapping region of the first write verification reference cell and a read current of the first charge trapping region of the third write verification reference cell is twice as large as a read current of the first charge trapping region of the second write verification reference cell.

10. The non-volatile semiconductor memory device of claim 5, wherein the verification reference setting section is configured to:
   trap a target program level of charge into a second charge trapping region of a first write verification reference cell and a second charge trapping region of a second write verification reference cell; and
   trap charge into a first charge trapping region of the second write verification reference cell so that a read current of a first charge trapping region of the first write verification reference cell is equal to a read current of the first charge trapping region of the second write verification reference cell, and neutralizes charge trapped in the second charge trapping region of the second write verification reference cell.

* * * * *